United States Patent [19]

Long

[11] 4,377,318
[45] Mar. 22, 1983

[54] LOW INSERTION FORCE ELECTRICAL INTERFACE ASSEMBLY AND ACTUABLE INTERFACE ASSEMBLY THEREFOR

[75] Inventor: Everett J. Long, Claremont, Calif.

[73] Assignee: Everett/Charles, Inc., Pomona, Calif.

[21] Appl. No.: 148,537

[22] Filed: May 9, 1980

Related U.S. Application Data

[63] Continuation of Ser. No. 875,231, Feb. 6, 1978, abandoned.

[51] Int. Cl.³ .............................................. H01R 13/54
[52] U.S. Cl. .................................................. 339/75 M
[58] Field of Search ................ 339/18 R, 18 B, 75 R, 339/75 M, 75 MP

[56] References Cited

U.S. PATENT DOCUMENTS 2,927,295  3/1960  Litz ................................. 339/18 B
4,045,109  8/1977  Langenback et al. ........... 339/75 M

*Primary Examiner*—Joseph H. McGlynn
*Attorney, Agent, or Firm*—Christie, Parker & Hale

[57] ABSTRACT

An actuable interface assembly for a connector to be mounted relative to an interface assembly. The connector comprises a first array of electrical interface contacts. The actuable interface assembly includes a second array of electrical interface contacts each for connection to a corresponding contact in the first array and carrier means for mounting the second array of contacts. The contacts in the first and second arrays are axially elongated to an exposed and free end. The first and second arrays of contacts are located, when the connector is mounted relative to the interface assembly, in mirror image to each other with each contact in the second array spaced apart from the corresponding contact in the first array in both axial and transverse directions by the same amount and in the same direction. Operable means is movable between a non actuated and an actuated condition. A compound movement cam means is connected to the operable means and to the carrier means and is operable for moving the carrier means. The operable means when continuously moved from the non actuated to the actuated condition first moves each of the contacts in the second array parallel with the axes of the corresponding contacts in the first array to a position which is opposed in a transverse direction with the free and exposed ends of the contacts, the second moves each of the contacts in the second array transverse to the axes of the corresponding contacts in the first array into engagement with the free and exposed ends of the corresponding contacts.

28 Claims, 16 Drawing Figures

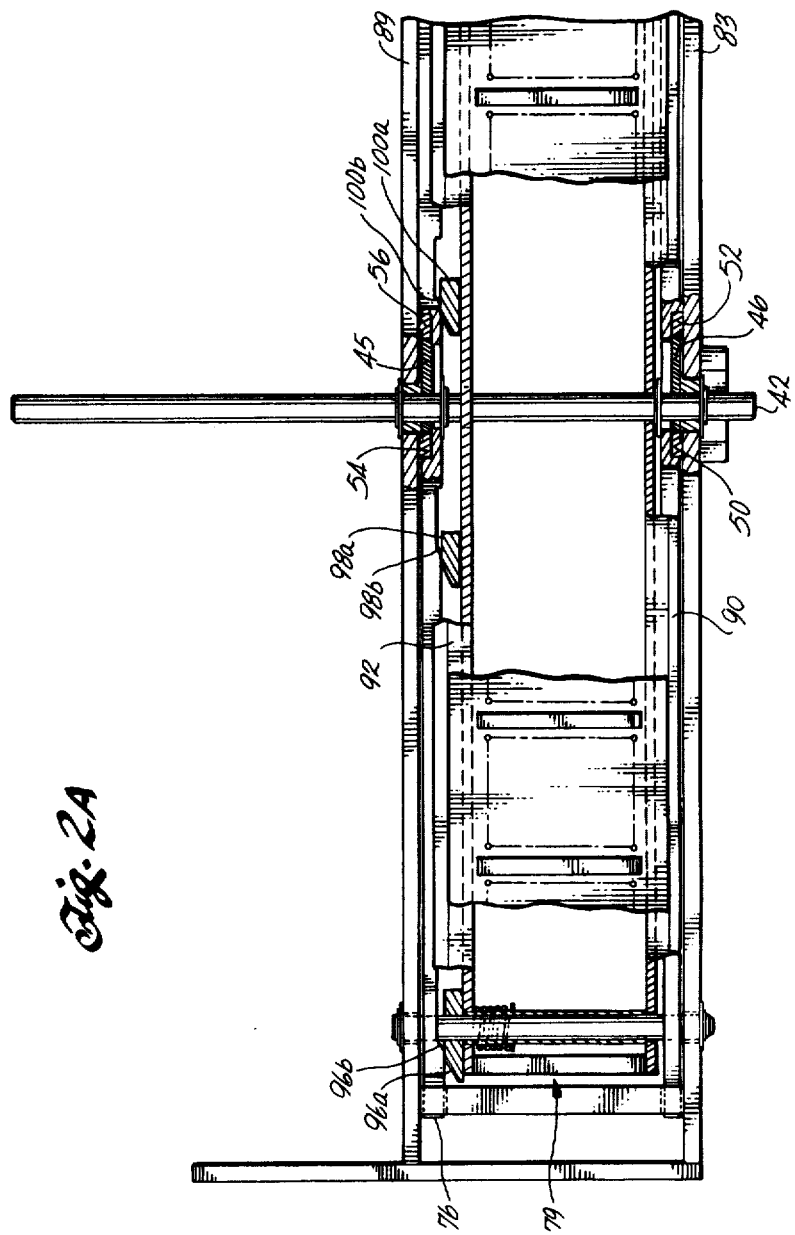

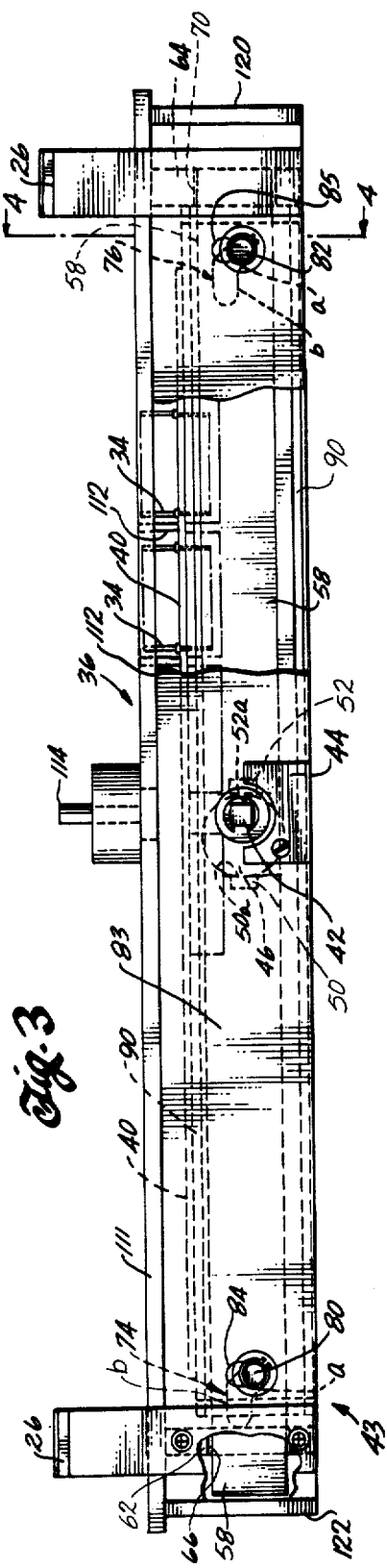
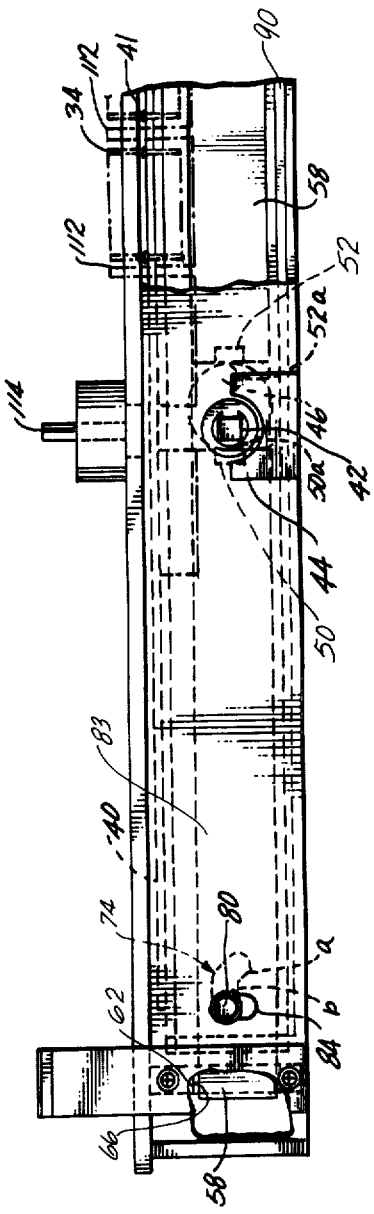

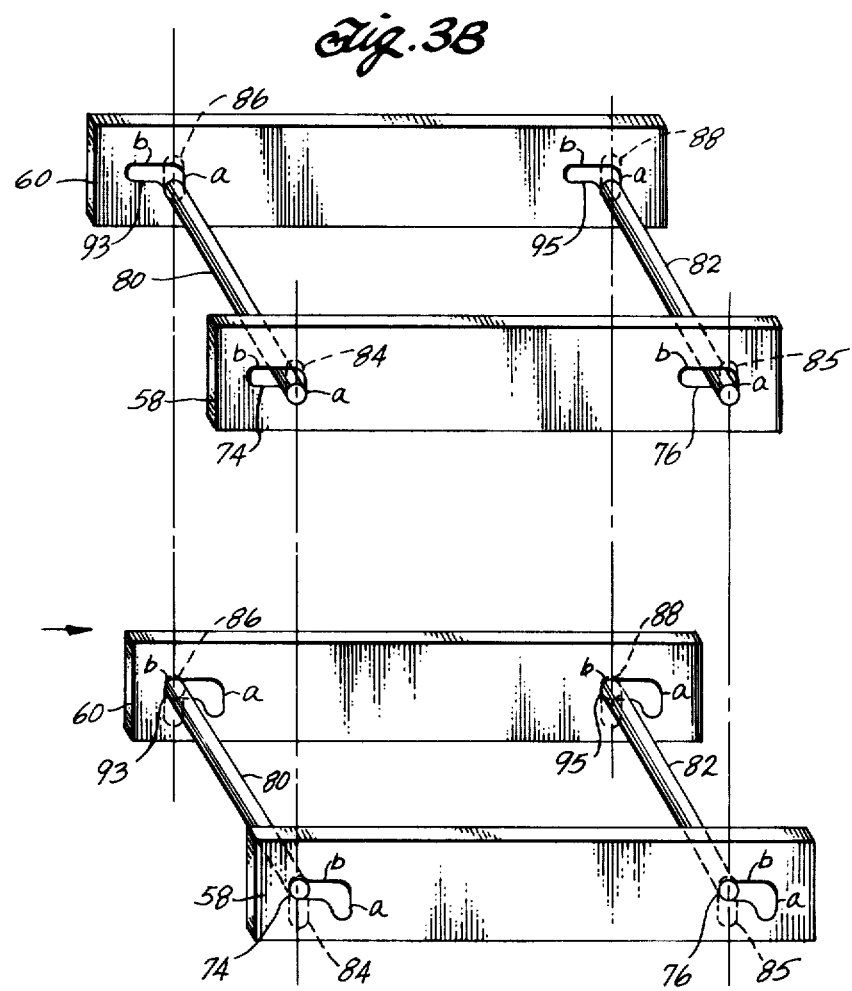

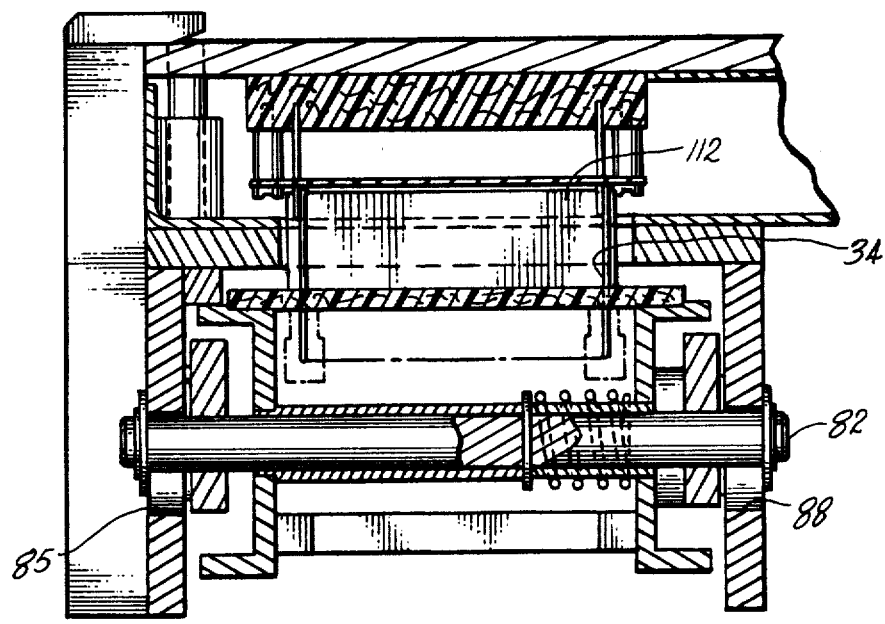
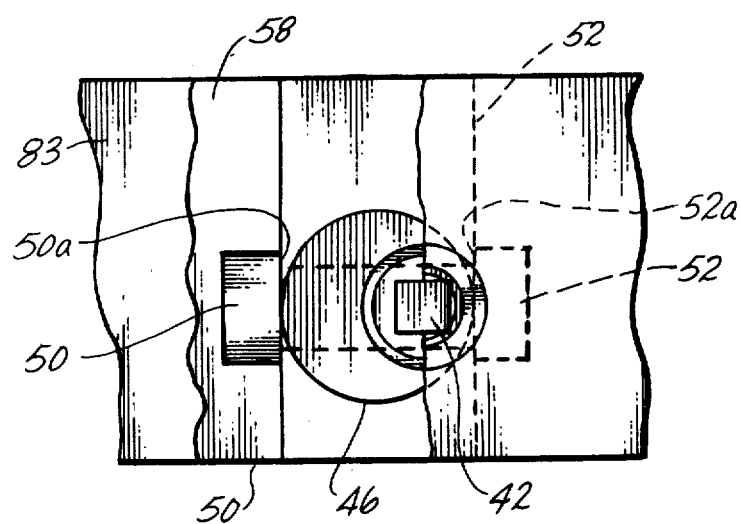

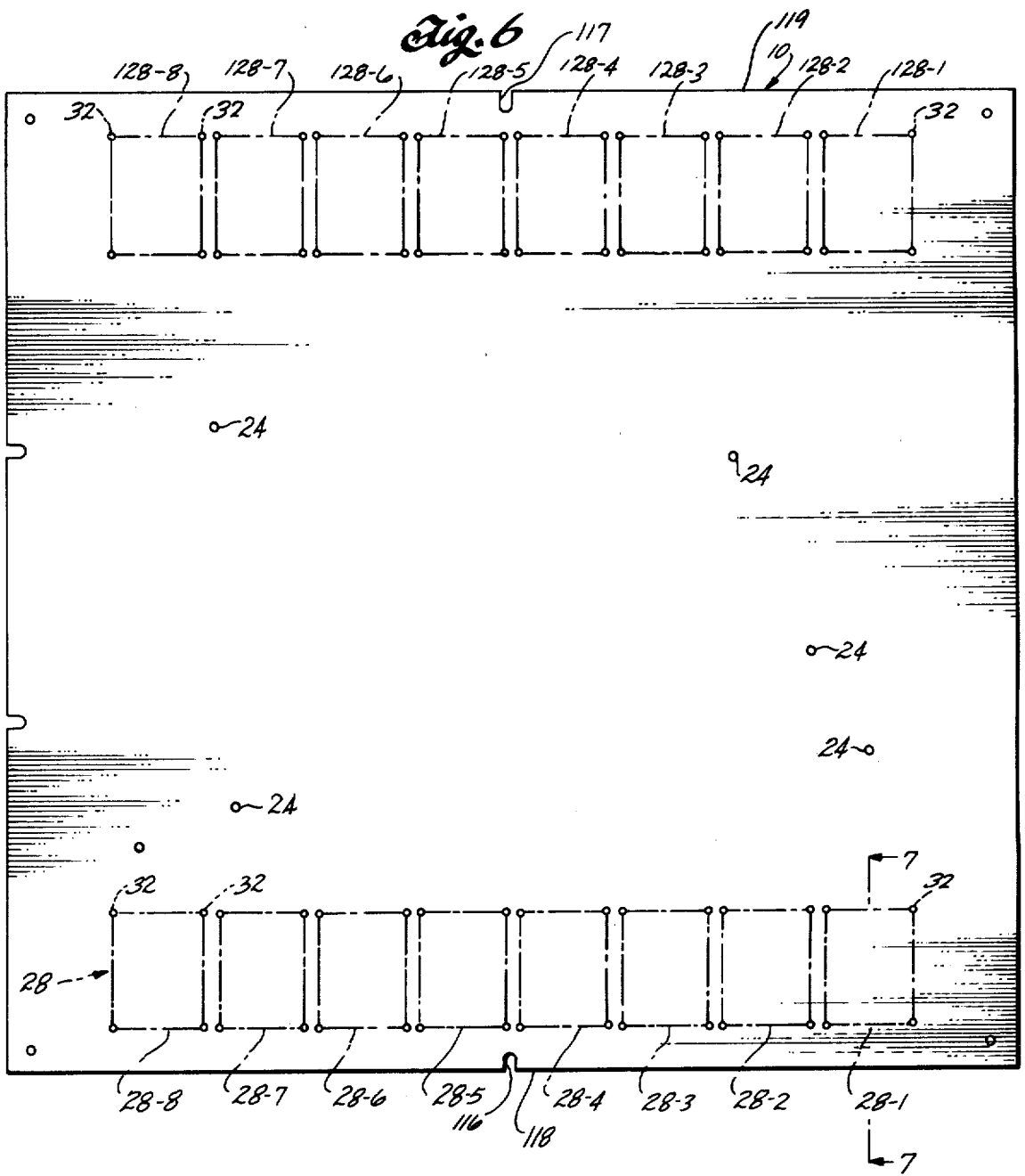

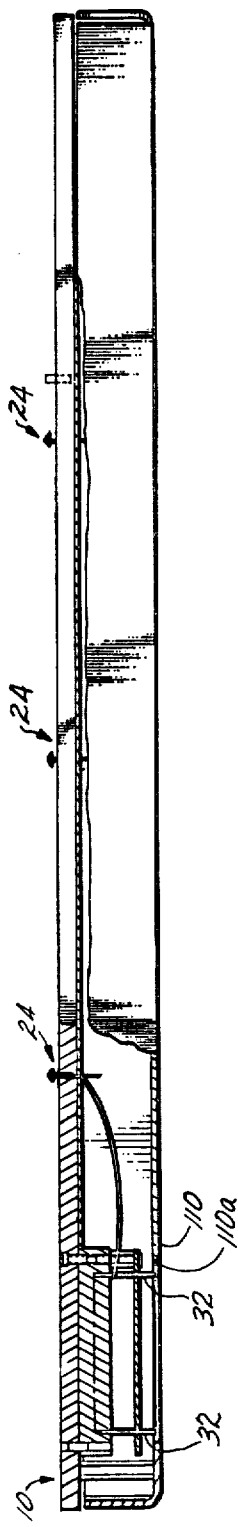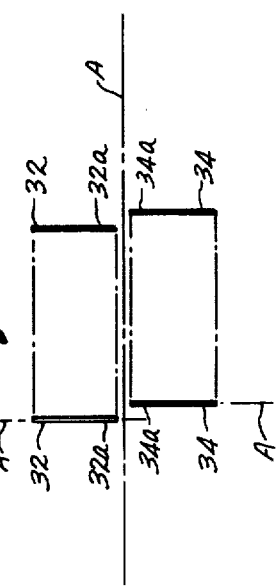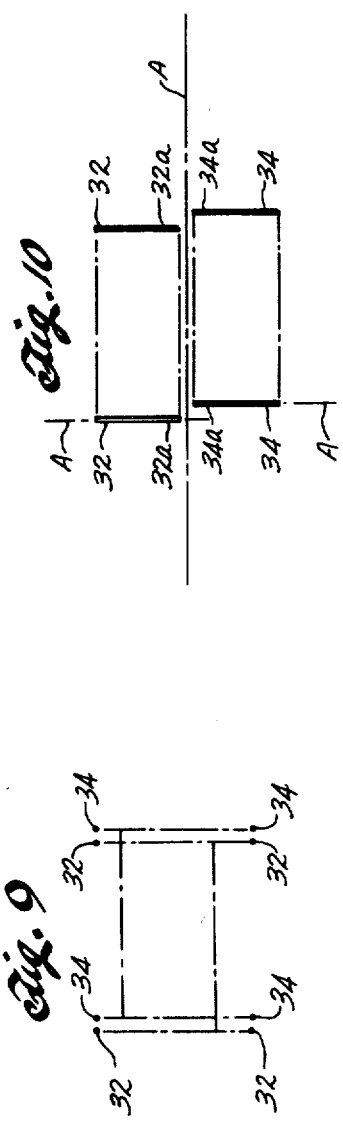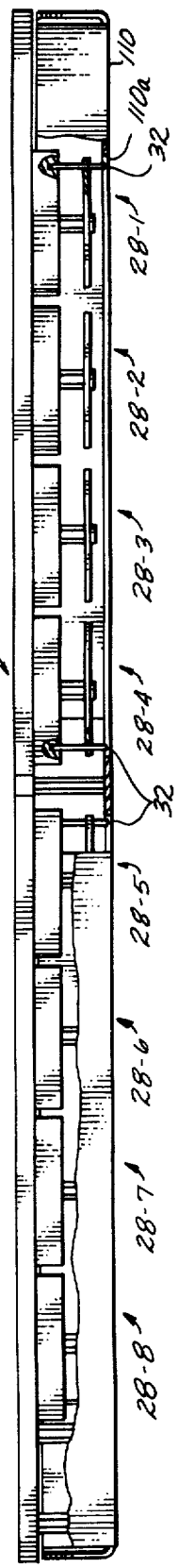

LOW INSERTION FORCE ELECTRICAL INTERFACE ASSEMBLY AND ACTUABLE INTERFACE ASSEMBLY THEREFOR

CROSS REFERENCE TO RELATED APPLICATIONS

This application is a continuation of copending application Ser. No. 875,231 filed Feb. 6, 1978, now abandoned.

BACKGROUND OF THE INVENTION

This invention relates to low insertion force interface connectors and more particularly to apparatus for moving an array of electrical contacts into engagement with a second array of electrical contacts.

Circuit board verifiers are generally known employing fixture systems which include an actuator assembly for relatively moving a plurality of electrical test probes and a printed circuit board into electrical contact. Many of these devices employ an interchangeable test head carrying the electrical test probes. Due to the interchangeability of the test head it is necessary to provide an interface connector system for making electrical connection with the rest of the circuit board verifier as the interchangeable test head is inserted into the fixture system.

To this end, interchangeable test heads have also been provided with interface pins, one interface pin for each of the possible positions of the test probes on the interchangeable test head and an electrical connection is made between the probes and the corresponding interface pins. Additionally a set of interface contacts are provided in the fixture system and are electrically connected to the circuit board verifier. The interface pins and the interface contacts are arranged in mirror image arrays with one of the contacts in the array of interface contacts corresponding to one of the interface pins in the array of interface pins. When the interchangeable test head is inserted into the fixture system, an electrical connection is made between each interface pin and the corresponding interface contact.

Various arrangements have been devised for bringing the interface pins and the interface contacts into engagement and thereby make electrical connection therebetween.

One class of such devices involves an arrangement wherein the interface pins on an interchangeable test head are brought into opposed but transversely spaced apart positions relative to the corresponding interface contacts as the interchangeable test head is inserted into the fixture system. Subsequently the interface contacts are actuated in a transverse direction into engagement with the interface pins. A disadvantage of such an arrangement is that as the interchangeable test head is being positioned into the fixture system, there is a possibility that the interface pins may improperly strike the interface contacts thereby causing damage to either or both of the interface pins and the interface contacts.

Another class of such devices involves interface contacts which are in the form of telescoping spring probes. Each telescoping spring probe (interface contact) is brought into engagement with the end of a corresponding interface pin. A disadvantage of such an arrangement is that a considerable amount of force is required to overcome the spring force of all of the spring probes (interface contacts).

Other interface connectors of various types are known for bringing two arrays of electrical contacts into engagement. However, these suffer from various disadvantages including those described above.

SUMMARY OF THE INVENTION

Briefly, an embodiment of the present invention involves an actuable interface assembly for a connector to be mounted relative to the interface assembly. The connector comprises a first array of electrical interface contacts. The actuable interface assembly includes a second array of electrical interface contacts each for connection to a corresponding contact in the first array and carrier means for mounting the second array of contacts. The contacts in the first and second arrays are axially elongated to an exposed and free end. The first and second arrays of contacts are located, when the connector is mounted relative to the interface assembly, in mirror image to each other with each contact in the second array spaced apart from the corresponding contact in the first array in both axial and transverse directions by the same amount and in the same direction. Operable means is movable between a non actuated and an actuated condition. A compound movement cam means is connected to the operable means and to the carrier means and is operable for moving the carrier means. The operable means when continuously moved from the non actuated to the actuated condition first moves each of the contacts in the second array parallel with the axes of the corresponding contacts in the first array to a position which is opposed in a transverse direction with the free and exposed ends of the corresponding contacts, and second moves each of the contacts in the second array transverse to the axes of the corresponding contacts in the first array into engagement with the free and exposed ends of the corresponding contacts.

By using the compound motion, the contacts are protected from damage due to interference when the connector is loaded or mounted relative to the actuable interface assembly. Additionally the connector can be engaged and disengaged by actuating the manually operable means with little effort due to mechanical advantages obtained in the compound cam driving means.

DRAWINGS

FIG. 1 is a pictorial view of the preferred electrical interconnect system in the form of a vacuum actuated fixture system for use in a circuit board verifier and embodying the present invention. A printed circuit board is depicted by broken lines on an interchangeable test head assembly. Portions of the printed circuit board and the interchangeable test head have been broken away to reveal the actuable interface assembly.

FIG. 2 is a top plan view of the actuable interface assembly removed from the vacuum actuated fixture system of FIG. 1 with the upper mounting plate removed. The interface contacts in the carrier plate are depicted schematically for simplicity. Portions of the assembly including the carrier plate and the carrier side frames have been broken away to reveal the rest of the interior parts of the actuable interface assembly.

FIG. 3 is a front side elevation view of the actuable interface assembly depicted in FIG. 2 with a portion of the side plate broken away to reveal the interior parts of the actuable interface assembly;

FIG. 3A is a view similar to FIG. 3 with the right hand side broken away and depicting the position of the carrier assembly after the knob has been fully actuated to the right. FIG. 3A depicts a side view of the assembly in the condition depicted in FIG. 2A.

FIG. 3B is a perspective and schematic diagram illustrating the cam bars, the shafts and the vertical slots in the side plates. The vertical slots and the side plates are depicted by broken line. The upper part of FIG. 3B depicts the cam bars positioned to the left with the shafts in the lower part of the slots, whereas the lower view in FIG. 3B depicts the cam bars moved to the right with the shafts in the upper part of the slots.

Figure 1:
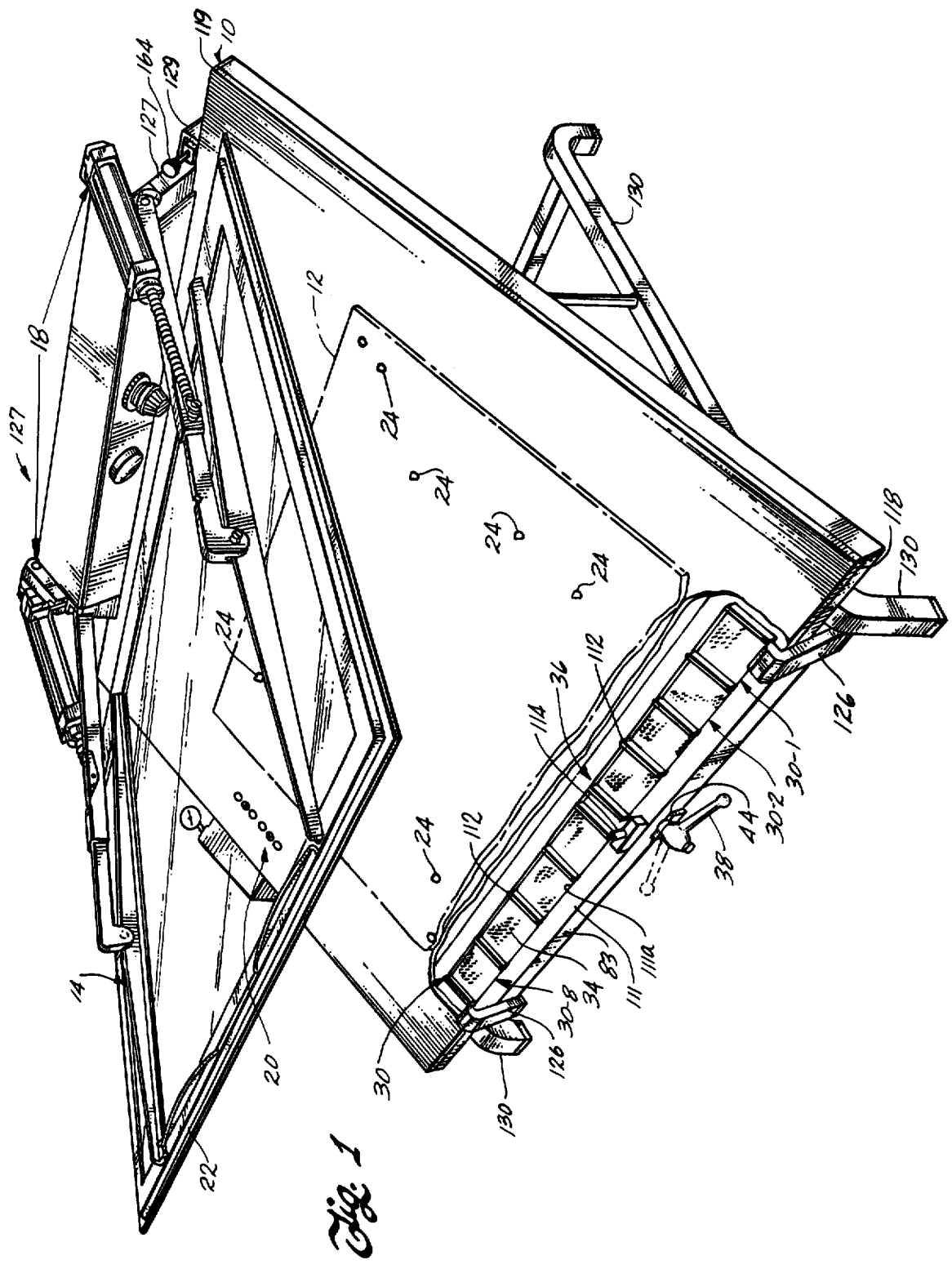
Figure 2:
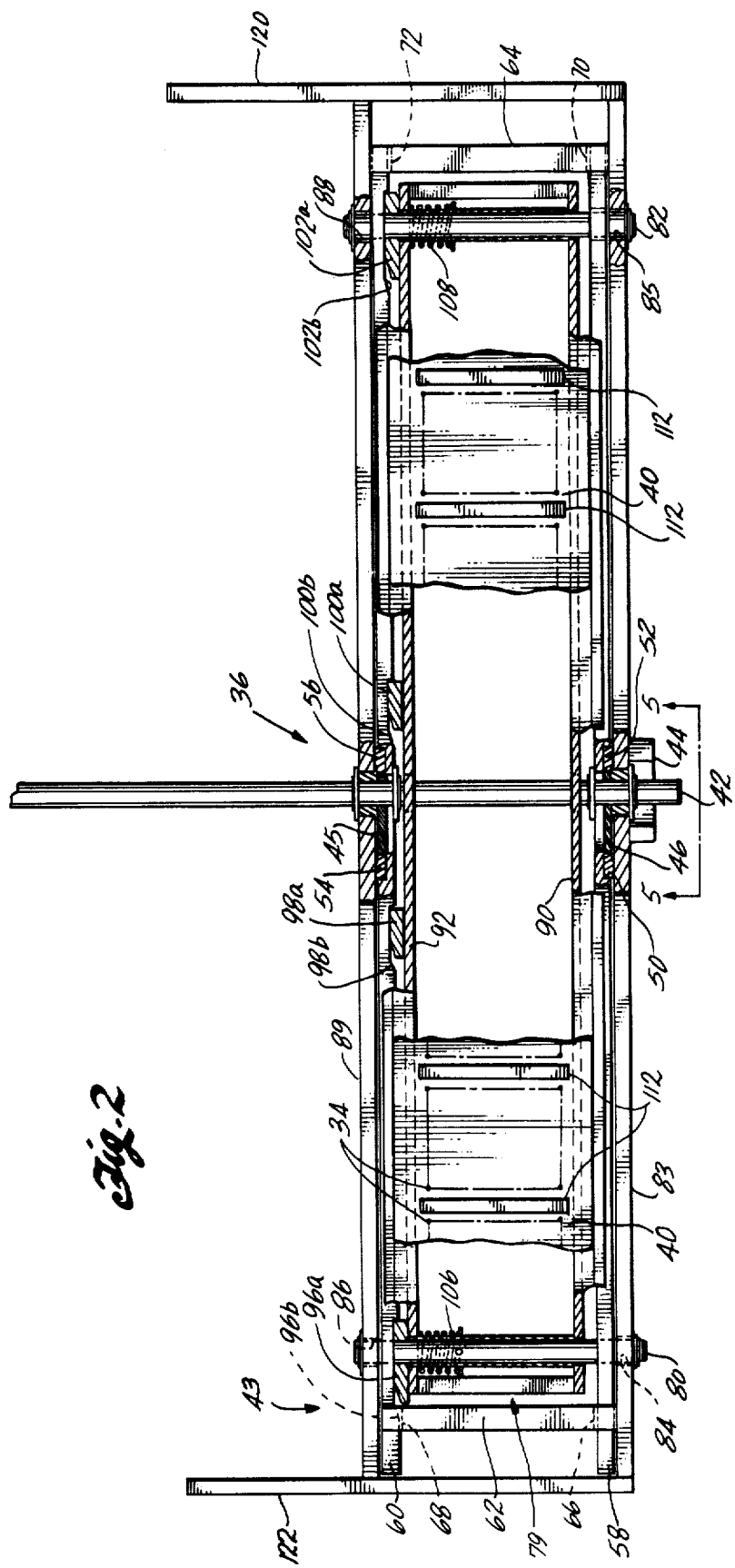
FIG. 2A is a view similar to FIG. 2 with the right hand portion broken away and depicting the position of the carrier assembly after the knob has been rotated 180° clockwise and the cam bars have been fully actuated to the right.
Figure 4:
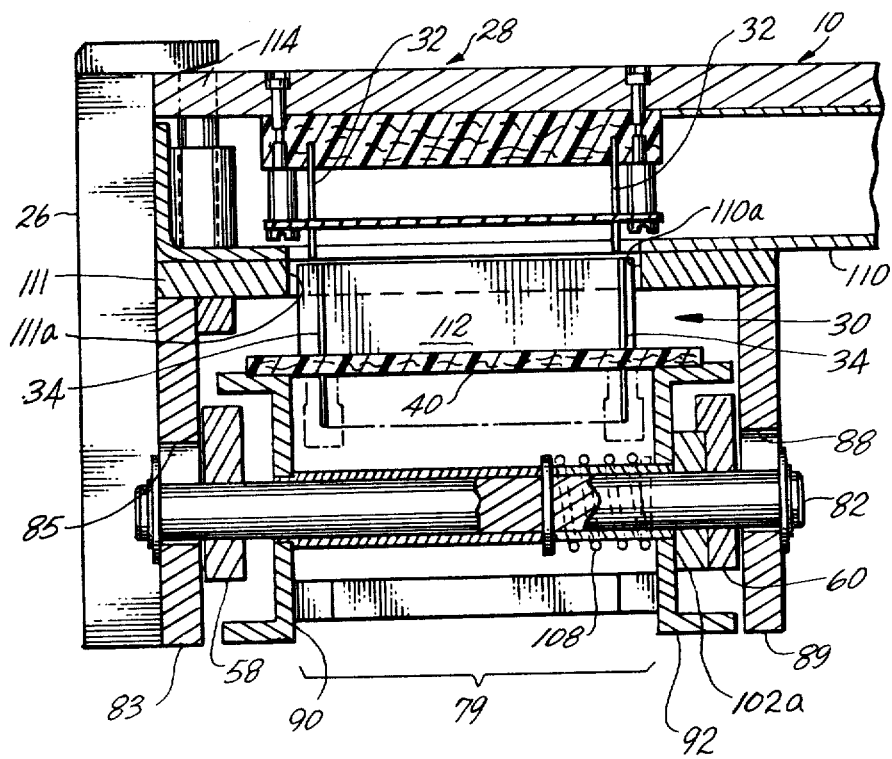
Figure 4A:
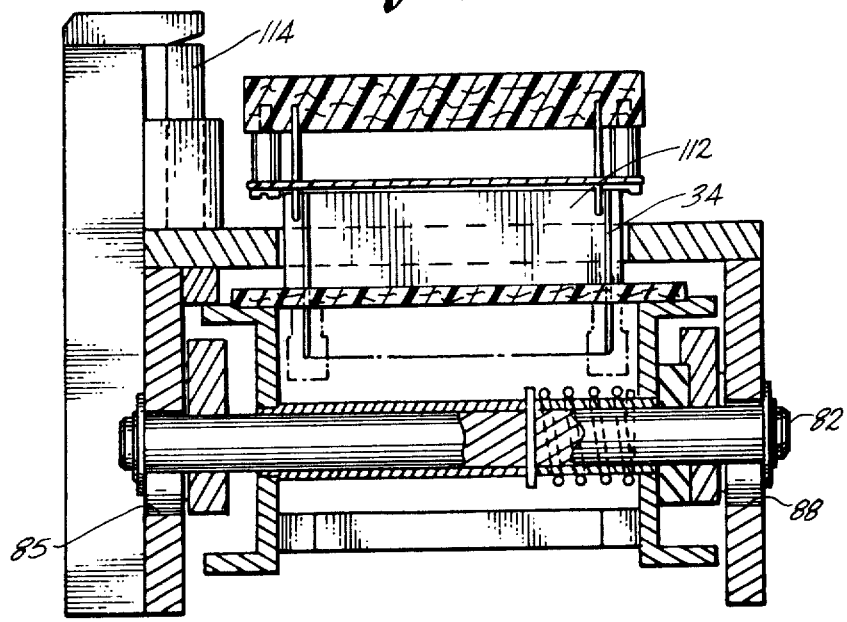
Figure 11:
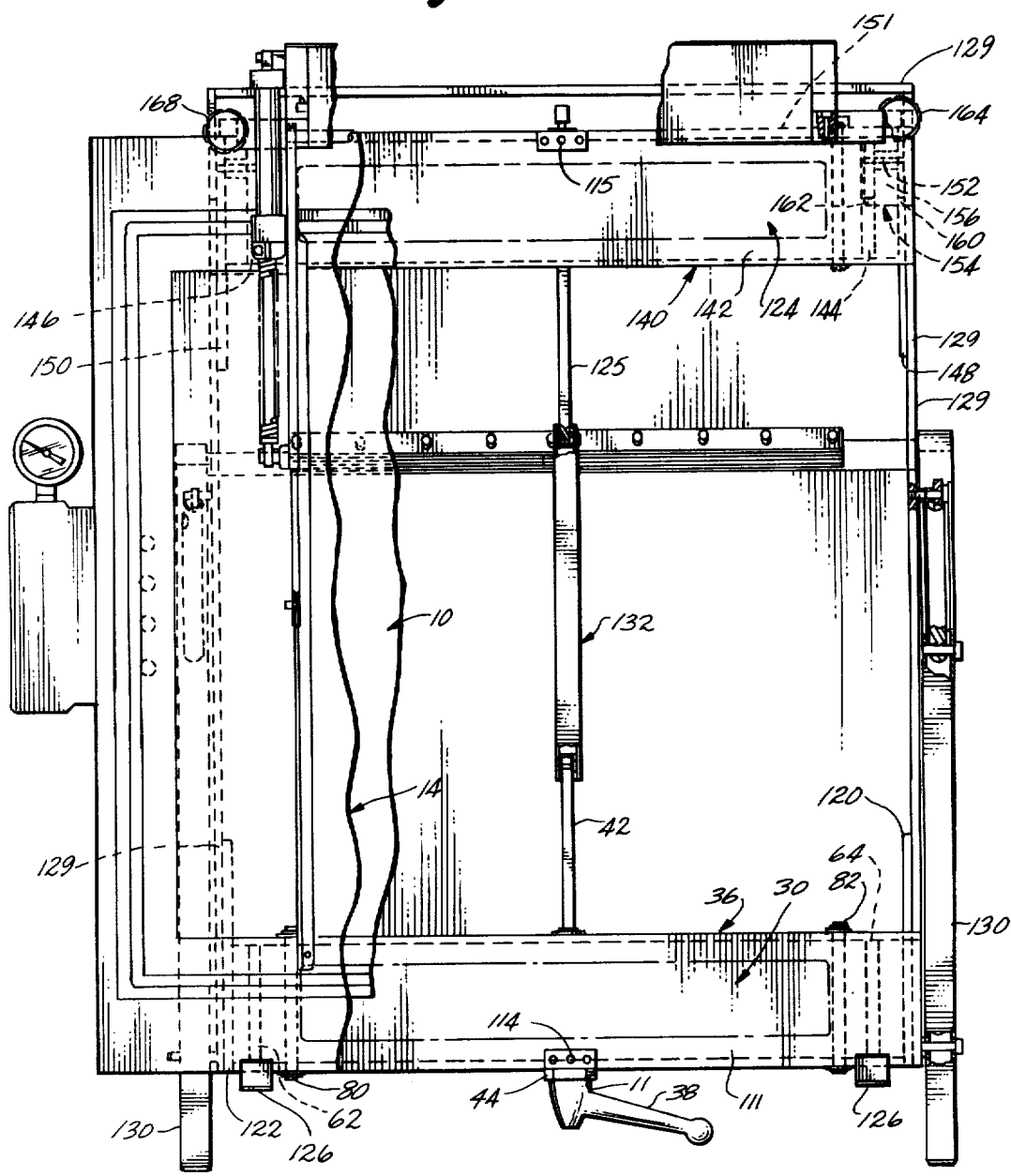
Figure 12:
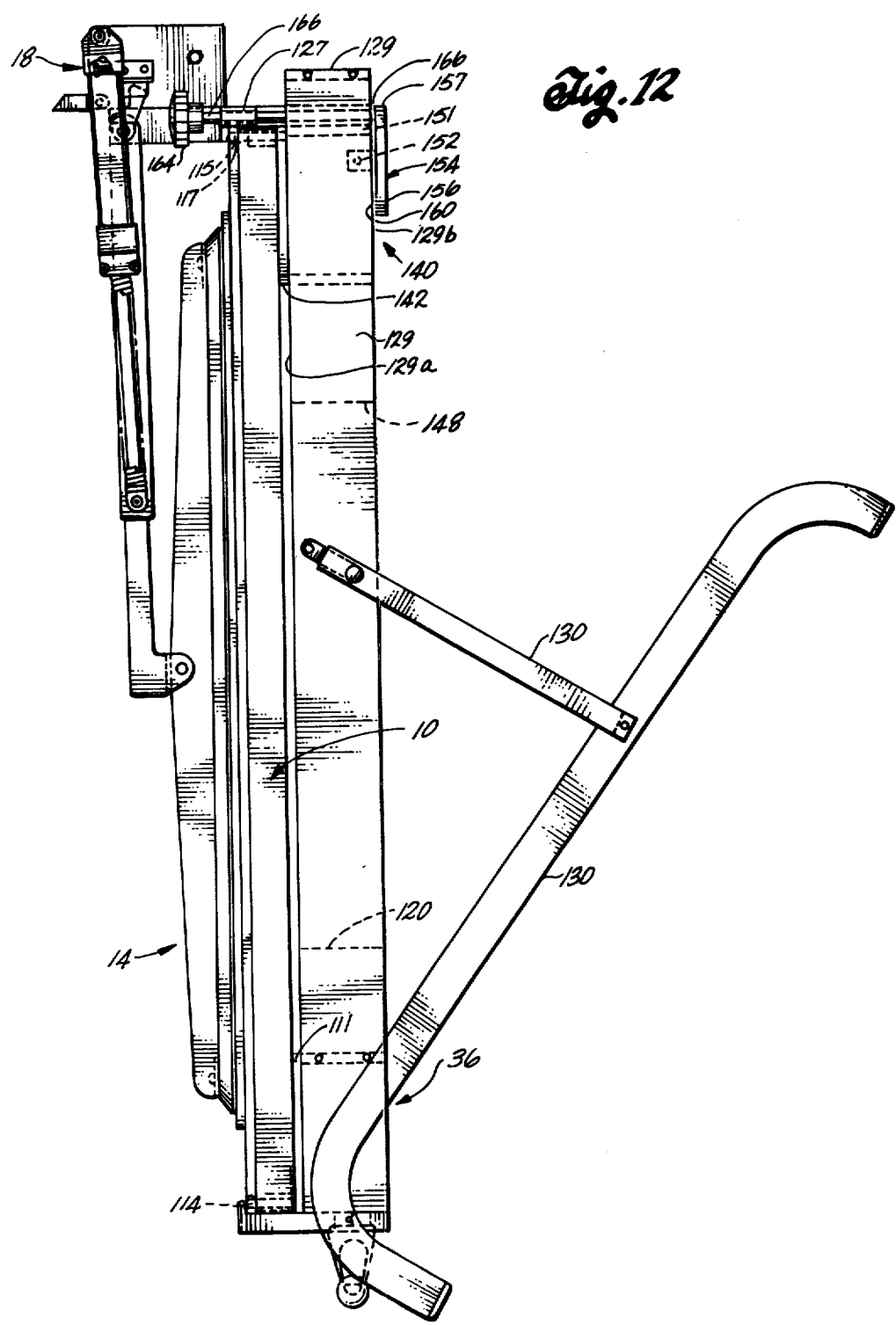

FIG. 4 is a view taken along lines 4—4 of FIG. 3 depicting a cross-sectional view of a portion of the interchangeable test head in place;

FIG. 4A is a view similar to FIG. 4 with a portion of the interchangeable test head removed for simplicity depicting the position of the carrier assembly and the interface contacts therein after the manually operable handle has been rotated clockwise 90°;

FIG. 4B is a view similar to FIG. 4 depicting the position of the carrier assembly and the interface contacts after the manually operable handle has been fully rotated clockwise 180°. The side thrust cam has actuated the interface contacts into engagement with the interface pins;

FIG. 5 is a view taken along lines 5—5 of FIG. 2 with a portion of the front side plate broken away to reveal portions of the front eccentric cam, the front cam bars and the front cam bearing;

FIG. 6 is a plan view of the interchangeable test head removed from the rest of the fixture system of FIG. 1. FIG. 6 schematically depicts by broken line the array of interface pins extending from the underneath side of the interchangeable test head;

FIG. 7 is a right side elevation view of the interchangeable test head of FIG. 6 with a section taken along the lines 7—7;

FIG. 8 is a front elevation view of the interchangeable test head as viewed in FIG. 6. A portion of the outer housing of the interchangeable test head has been broken away to reveal the array of interface contacts;

FIG. 9 is a schematic view of the contacts and pins after the interchangeable test head has been inserted into the frame and before the actuable interface assembly has been actuated, the handle being positioned in the position depicted by phantom line in FIG. 1. FIG. 9 depicts the displacement of the contacts 34 from the pins 32 in a transverse direction;

FIG. 10 is a schematic illustration showing a side elevation view of the contacts of FIG. 9 illustrating that the contacts and pins are displaced both in a transverse and in an axial direction;

FIG. 11 is a plan view of the vacuum actuated fixture system of FIG. 1 with the interchangeable test head removed, showing the arrays of interface contacts and the combined locking and contact protection members in schematic, portions of the vacuum actuated system including a portion of the door being broken away for clarity; and FIG. 12 is a right side elevation view of the vacuum actuated fixture system of FIG. 11 with the interchangeable test head in place.

DESCRIPTION

FIG. 1 depicts a vacuum actuated fixture system for making electrical contact with test points on a side of a planar test member. The fixture system includes an interchangeable test head 10. For purposes of illustration a printed circuit board is depicted by broken line at 12 at a test location on the interchangeable test head 10. A door 14 is hinged by hinges 18 from a rear clamping member 127 which will be described in more detail. The door 14 when open provides access for positioning the circuit board 12 and when closed, closes access to the circuit board and also provides a vacuum chamber between the door and the interchangeable test head which not only encompasses the circuit board 12 but also encompasses a row of vacuum ports 20. The closed cavity is sealed by means of a resilient gasket 22 which is mounted on the door 14 and extends around the perimeter thereof. The seal 22, when the door is closed, provides a seal between the door and the upper planar surface of the interchangeable test head around the perimeter of the cavity.

When vacuum is applied through the vacuum ports 20 (by means not shown) the seal 22 deforms causing the door to be drawn down towards the circuit board 12 thereby causing the circuit board to move into engagement with an array of spring loaded probes which are arranged corresponding to the pattern on the circuit board to be tested. A limited number of such probes are depicted at 24 by way of example. The probes 24 are mounted in the interchangeable test head 10.

The interchangeable test head 10 is removable from the rest of the vacuum fixture system as depicted in FIGS. 6, 7, 8 and 11 as will be explained in more detail. The interchangeable test head 10 may be removed and replaced by another test head with test probes 24 arranged in a different configuration or array selected according to the pattern on the circuit board for test.

Significantly the interchangeable test head has an array of test head interface pins or contacts 32 exposed at the bottom side of the interchangeable test head 10 (FIGS. 4, 7, 8 and 9) which are to mate and thereby make electrical contact with an array 30 of interface contacts 34. The array of interface contacts 30 is carried in an actuable interface assembly 36. As depicted schematically in FIGS. 1 and 8, the interface contacts and the interface pins are arranged into eight groups 30-1 through 30-8 and 28-1 through 28-8, respectively. The pins in array 30 are referenced by numeral 32, and the contacts in array 28 are referenced by numeral 34. 256 pins or contacts are provided in each group. However, for simplicity, of the array 28, only three pins 32 are depicted in FIG. 8 and only two are depicted in FIGS. 4, 4A, 4B and 7. Also, of the array 30, only two of contacts 34 are shown in FIGS. 4, 4A and 4B. The connection of one interface pin 32 to a probe 24 is depicted in FIG. 7 by way of example. It is understood that all probes 24 are actually connected in the same manner to a separate and corresponding interface pin 32.

The pins in each group and the contacts in each group are arranged into rows and columns. As depicted in FIG. 4 and as schematically depicted in FIGS. 9 and 10, each of the contacts and pins is elongated along an axis to an exposed and free end and is disposed in substantially parallel relationship to each other. The free ends of the pins 32 are depicted at 32a and the free ends of the contacts 34 are depicted at 34a.

When the interchangeable test head 10 is inserted into the frame and before the actuable interface assembly 36 has been actuated, the array of contacts and array of pins are arranged in mirror image to each other with each contact 34 spaced apart from a single corresponding pin 32. As depicted in FIGS. 4 and 10, the contacts 34 and pins 32 are spaced apart both in an axial direction and in a direction which is transverse to the axes of the contacts and pins. The axis is depicted at "A" in FIG. 10. To be explained in more detail, as the actuable interface assembly 36 is actuated, through rotation of the handle 38 to the solid position depicted in FIG. 1, the contacts will be moved first parallel with the axes of the contacts and pins and then transverse to such axes until each of the contacts is in engagement with the corresponding pin as depicted in FIG. 4B.

Consider briefly the operation of the low insertion force electrical interconnect system as the interface contacts in the actuable interface assembly 36 are moved into engagement with the interface pins of the interchangeable test head 10. The interchangeable test head 10 has been positioned as generally depicted in FIGS. 1 and 4 with handle 38 positioned at the left as depicted by phantom line in FIG. 1. At this point all of the contacts 34 in the array 30 are in a deactuated (non actuated) or down position as generally depicted in FIGS. 4 and 10. Next the handle 38 is rotated clockwise through a 180° angle to the actuated condition or position depicted by solid line in FIG. 1. As the handle is rotated clockwise through the 180° angle, the interface contacts 34 are moved in two steps but along a plane that is parallel with the plane of the paper depicted in FIGS. 4 and 10. Specifically, as the handle 38 is moved through the first 90°, the interface contacts 34 are moved parallel with the axes of the contacts and pins to the position depicted in FIG. 4A where each interface contact 34 is in opposition to but spaced away at the right side of the free and exposed end of the corresponding interface pin 32. During the second 90° of rotation of the handle, each interface contact 34 is moved to the left, transversely to the axes of the contacts and pins until it engages the corresponding interface pin 32, as depicted at FIG. 4B.

To be described in more detail, the actuable interface assembly 36 includes the handle 38 and compound movement cam means for moving carrier plate 40 on which contacts 34 are mounted starting with the deactuated (non actuated) condition of FIG. 4 so each interface contact is moved parallel with the axes of the interface pins and contacts to the relatively opposed position with the corresponding interface pin as depicted in FIG. 4A (during the first 90° movement of the handle 38) and each interface contact is moved transverse to the axes of the interface pins and contacts and into engagement with the free and exposed end of the corresponding interface pin to the position depicted in FIG. 4B (during the second 90° movement of the handle 38).

Consider now the actuable interface assembly 36 in more detail. The handle 38 is connected to a drive shaft 42. The extremities of the 180° angle of rotation for the handle are defined by a stop 44 which engages an interference 11 (see FIG. 11) on the handle at the extremities of the 180° angle of rotation.

Mounted on the shaft 42 and forming part of the compound cam means are two eccentric circular cams 46 and 45, one at each side of the actuable interface assembly 36. To be explained in more detail, cams 45 and 46 in combination with the shaft 42 form means for moving cam bars 58 and 60 horizontally left and right as seen in FIG. 3. The eccentric and circular configuration of the cam 46 can be seen in the sectional view of FIG. 5 and by the broken lines in FIG. 3. The eccentric cams 46 and 45 are identical in shape. The eccentric cams 46 and 45 rotate between pairs of cam bearings 50,52 and 54,56, respectively. The cam bearings in each pair are spaced apart and have parallel faces between which the cams 46 and 45 rotate eccentrically. The parallel faces of the pair of cam bearings 50,52 are depicted at, respectively, 50a and 52a in FIGS. 3 and 5 (see dashed lines in FIG. 3).

The pairs of cam bearings 50,52 and 54,56 are mounted in slots provided in the two cam bars 58 and 60 which also form part of the compound cam means. The cam bars 58 and 60, best seen in FIGS. 2, 3 and 4, extend through notches contained in end plates 62 and 64 positioned at the left and right hand ends, respectively, of the actuable interface assembly. The notches in end plate 62 are depicted by dashed lines at 66 and 68 and in end plate 64 at 70 and 72 in FIGS. 2 and 3. Notches 66 are seen through the broken away portion of side 83 in FIG. 3. Significantly the upper and lower surfaces of the notches 66, 68, 70 and 72 prevent vertical motion of and confine movement of the cam bars 58 and 60 so that they only move transversely to the axes of the contacts and pins (from left to right or from right to left as depicted in FIGS. 2 and 3).

The compound cam means includes two identical cam slots in each of the cam bars 58 and 60. The cam slots in cam bar 58 are depicted at 74 and 76 in FIG. 3B and by hidden lines in FIG. 3. The cam slots in cam bar 60 are depicted at 93 and 95 in FIG. 3B. Significantly the cam slots 93, 95, 74 and 76 each have an inclined cam portion "a" and an interconnected dwell cam portion "b". The inclined portion "a" extends at an acute angle to the axis of the pins 32 and contacts 34. Dwell portion "b" extends at right angles or transverse to the axes of the pins 32 and contacts 34.

The compound cam means also includes two vertical slots 84,85 in side plate 83 (FIGS. 2, 3 and 4) and two vertical slots 86,88 (see FIGS. 2,4) in side plate 89. The slots 84–88 are all identical and are elongated parallel with the axes of the interface pins 32 and interface contacts 34.

A carrier assembly 79 (FIG. 4) is provided which includes shifts 80 and 82. Looking at the left side of FIGS. 2, 3 and 3B, the shaft 80 extends through the cam slot 74 in cam bar 58, the cam slot 93 in cam bar 60 (FIG. 3B), the vertical slot 84 in side plate 83 and the vertical slot 86 in side plate 89. Looking at the right side of FIGS. 2, 3 and 3B, the shaft 82 extends through the cam slot 76 in cam bar 58, the cam slot 95 in cam bar 60, the vertical slot 85 in side plate 83 and the vertical slot 88 in the side plate 89. It will be noted that the shafts 80 and 82 are constrained by the vertical slots so that they only move in a direction which is parallel with the axes of the interface pins 32 and the interface contacts 34. Thus, movement of the cam bars 58 and 60 to the right will first cause the riser portions "a" of the cam slots to raise the shafts 80 and 82 parallel with the axes of the pins and contacts and subsequently the dwell portion "b" of the cam slots will leave the shafts 80 and 82 in the same vertical position as depicted in FIG. 3. To be explained in more detail, during the latter movement of the cam bars the interface contacts 34 are moved in a transverse direction to the axes of the interface pins 32 until the interface contacts are in opposed relation to the corresponding interface pins. In this manner the shafts 80 and 82 being connected to the contact carrier plate follow the corresponding cam portions of the cam slots for guiding movement of the carrier plate.

Included in the carrier assembly 79 are carrier side frames 90 and 92 which are mounted on the shafts 80 and 82. The carrier side frames 90 and 92 mount carrier plate 40 which is mounted in notches formed in the carrier side frames.

The compound cam means includes side thrust cams. The side thrust cams include cam parts 96a, 98a, 100a and 102a which are mounted on the carrier side frame 92, and inclined surfaces in cam bar 60 forming cam parts 96b, 98b, 100b and 102b (FIG. 2). The cam bar 60 has a notch adjacent each inclined surface in which the cam parts 96a, 98a, 100a and 102a extend in the position of the cam bars depicted in FIG. 2. Coil compression springs 106 and 108 act between a collar provided on the shafts 80 and 82 and the carrier side frame 92. The carrier side frames 90 and 92 are slidably mounted axially with respect to the shafts 80 and 82. When the cam bars 58 and 60 are moved to the right in FIG. 2, the inclined surfaces of the cam bar 60 engage the side thrust cam parts, forcing them and the connected side carrier frame 92 to move sideways or downward as depicted in FIG. 2. It is this movement that causes the interface contacts 34 to move in a transverse direction into contact with the interface pins 32.

Snap springs and washers are provided on the ends of the shafts 80 and 82 to retain them in the side plates 83 and 89, and snap rings and washers are provided on the drive shaft 42 for maintaining it in a fixed position relative to the side plates 83 and 89 in a manner well known in the art.

Handle 38 is for manually operating the drive shaft 42. However, the drive shaft 42 need not be manually operated but may be driven automatically as by a motor or other means well known in the art.

Consider now the operation of the actuable interface assembly 36. Beginning with handle 38 to the left as depicted in FIG. 1, handle 38 is rotated clockwise and continuously through a 180° angle of rotation. During the first 90° of rotation of handle 38 the shaft 42 rotates the eccentric cam 46 clockwise, moving the cam bars 58 and 60 to the right in FIG. 3, causing the riser portions "a" of the cam slots in the cam bars 58 and 60 to raise the shafts 80 and 82 to the dwell portions "b" of the cam slots. During this movement the carrier side frames 90 and 92 and the carrier plate 40 of carrier assembly 79, which are carried on the shafts 80 and 82, rise (as seen in FIGS. 3 and 4), moving the contacts 34 parallel with the axes of the interface pins 32 until they are in opposed relation to the free ends of the interface pins 32 as depicted in FIG. 4A. Although the cam bars 58 and 60 are short of the horizontal position, depicted in FIG. 3A, FIG. 3A depicts the vertical position of the carrier plate 40, the shaft 80 and the interface contacts 34.

Continued rotation of handle 38 and thereby the drive shaft through the remaining 90° causes the eccentric cam 46 to continue to move the cam bars 58 and 60 to the right to the final position depicted in FIGS. 2A and 3A. During this movement the inclined surfaces on the cam bars engage the side thrust cams as depicted in FIG. 2A, thereby moving the side thrust cams, the carrier side frames, the carrier plate and the interface contacts 34 downward as depicted in FIGS. 2 and 2A and to the left as depicted in FIGS. 4, 4A and 4B. This movement continues with the rotation of the handle until the contacts 34 move into electrical engagement with the interface pins 32 as depicted at FIG. 4B.

Conversely, rotation of handle 38 counterclockwise will cause the cam bars 58 and 60 to move back to the left as depicted in FIGS. 2 and 3, allowing the side thrust cams to disengage from inclined surfaces on the cam bars and allowing the springs 106 and 108 to force the carrier side frames, the carrier plate and the interface contacts 34 away from the interface pins so that the interchangeable test head 10 can be removed without damaging the interface pins and contacts.

The interconnect system includes contact protection members. Specifically, the interchangeable test head 10 includes a lower planar mounting member 110 which extends beyond the free and exposed ends of the interface contacts 34 in the direction of the interface contacts 34 (see FIGS. 4, 7 and 8). Additionally, the actuable interface assembly 36 includes a mounting plate 111 which extends beyond the free ends of the interface contacts 34 in the direction of the interface pins 32 when the deactuated condition exists. Openings 110a and 111a are provided in the mounting member 110 and the mounting plate 111 which expose the free ends of the interface contacts and pins. However, significantly the mounting member 110 and mounting plate 111 prevent the interface pins and contacts from coming into engagement during insertion of the interchangeable test head 10.

A combined locking and contact protection member 112 is positioned at each end of each group of interface contacts in the array 30. The combined locking and contact protection members 112 are mounted in the carrier plate 40 and move upward into the opening 110a in the interchangeable test head during the upward movement of the carrier assembly, moving to the left as depicted in FIG. 4 during the side movement of the carrier assembly. As depicted in FIGS. 4 and 4B, the combined locking and contact protection members extend slightly beyond the ends of the interface contacts 34 in the direction of the interface pins 32 thereby providing additional protection so that the interface contacts 34 are not damaged as the interchangeable test head is positioned in place.

The carrier plate 40 is formed of a non-conductive material, preferably a glass epoxy, and the interface contacts 34 are press-fit into the carrier plate. The glass epoxy forms an insulation material which electrically isolates each of the interface contacts.

It will be understood that the interchangeable test head must be precisely aligned so that the interface pins therein are oriented at the correct positions axial and transverse relative to the interface contacts. To this end, locating pins 114 and 115 (FIGS. 1 and 11), mounting plates 111 and 142 and front and rear clamping members 126 and 127 are provided. The interchangeable test head 10 includes locating slots 116 and 117 (FIG. 6) which mate with the locating pins 114 and 115 thereby providing proper orientation and relationship from left to right as seen in FIG. 1. The interchangeable test head 10 also includes a lower mounting surface on the mounting member 110 and front and rear edges 118 and 119 which properly orient the interchangeable test head when mounted, respectively, on the upper plate 111 and against the front and rear clamping members 126 and 127.

The vacuum fixture system of FIG. 1 has a second actuable interface assembly 140 at the rear (top of FIGS. 1, 11 and 12) and below the interchangeable interface assembly. Referring to FIG. 11 the array of interface contacts 30 and the protection members 112 are illustrated in schematic within a rectangular broken line and the array 124 of contacts and protection members depicted by a rectangular broken line on the rear actuable interface assembly 140 is essentially identical thereto. The array of contacts 124 is essentially identical to the array 30 and the axes of the contacts in the arrays 124 and 30 are at right angles to the plane of the paper in FIG. 11.

As schematically depicted in FIG. 6 the interchangeable test head 10 has an array 128 of interface pins 32 at the rear thereof. Although the array 128 is schematically depicted (for convenience) on the upper surface of the interchangeable test head 10, it will be understood that each pin 32 thereof actually extends from the bottom side of the interchangeable test head, at right angles to the plane of the paper in FIG. 6, the same as each pin in array 28. Each pin in array 128 is for engagement with a corresponding one of the interface contacts in the array 124.

Although the rear actuable interface assembly 140 is not shown in detail, it is similar to the front actuable interface assembly 36 and includes a compound cam movement means which moves each of the interface contacts in the array 124 in a plane parallel with the axis of the interface contacts thereof. Specifically, each of the interface contacts is first moved in an axial direction to an opposed position to the corresponding interface pin and second is moved in a transverse direction until each interface contact is in electrical contact with the corresponding interface pin, just the same as each contact in array 30 is moved relative to the corresponding pin in array 28. However, the transverse movement of the contacts in the array 30 into engagement with the corresponding pins in the array 28 is in a direction toward the front of the fixture (downward) as seen in FIG. 11, whereas the transverse movement of the contacts in the array 124 into engagement with the corresponding pins in the array 128 is toward the rear of the fixture (upward) as seen in FIG. 11. As a result, the forces created due to the interaction of the contacts and pins in arrays 30 and 28 are in the opposite direction to the forces created due to the interaction of the contacts and pins in arrays 124 and 128. The resultant force on the interchangeable test head is thus zero. This is quite important as the drive shaft 42 is coupled through a slidable couple 132 to the corresponding drive shaft 125 and compound movement means of the upper actuable interface assembly 140 and hence activates the upper actuable interface assembly simultaneously with the lower one.

The lower and upper actuable interface assemblies are mounted to rectangular shaped frame 129 which in turn is attached to support members 130. The lower actuable interface assembly 36 is affixed to the frame 129 with the mounting plate 111 resting on the upper edge 129a of frame 129 and outer end plates 120 and 122 affixed to the inner side of the frame 129 by nuts and bolts.

To accommodate various sizes of interchangeable test heads and to allow the interchangeable test head to be removed from the fixture, the upper actuable interface assembly 140 is movable in a direction between the front and rear of the fixture (top to bottom as seen in FIGS. 11 and 12). Although the upper actuable interface assembly 140 has very similar parts performing the same function as that described herein for the lower actuable interface assembly 36, and therefore need not be described in detail, some of the exterior parts are described so as to provide a better understanding of the way in which the interchangeable interface assembly is removed and inserted in the fixture. As described above, the lower interface assembly has inner and outer end plates 62,64 and 120,122 to which the mounting plate 111 is attached and corresponding thereto the upper interface assembly 140 has inner and outer end plates 144,146 and 148,150 to which mounting plate 142 is attached. Front clamping members 126 are attached to the side plate 83 of lower actuable interface assembly 36. Similarly, rear clamping members 127 are attached to a side plate 151 of the upper actuable interface assembly 140.

Not included in the lower one, the upper actuable interface assembly 140 carries a pivot pin or member 152 mounted between inner and outer end plates 144 and 148 to provide a trunion pivotal mounting for "T" shaped clamp 154. Leg 156 of the "T" shaped clamp 154 is generally enlarged, planar and rectangular in shape. The leg 156 bridges across the lower edge of inner end plate 144 to the lower edge 129b of the adjacent side of frame 129. The leg 156 of "T" shaped clamp 154 has feet 160 and 162 thereon, the shape of which is best seen in FIG. 12, which engage the lower edges (see FIGS. 11 and 12) of inner end plate 144 and frame 129, respectively. A knob 164 is affixed to the end of a threaded shaft 166 which in turn is threaded through rear clamping member 127. The opposite end of shaft 166 from knob 164 engages the end 157 of leg 156 which is opposite from the feet 160 and 162. Rotation of knob 164 and shaft 166 so as to pivot "T" shaped clamp 154 clockwise as seen in FIG. 12 tightens the feet of clamp 154 against the bottom edges of the inner end plate 144 and the frame 129 thereby clamping the actuable interface assembly in fixed relation to frame 129. Rotation of the knob and screw so that "T" shaped clamp 154 is free to pivot about pivot member 152 frees the actuable interface assembly 140 so that it is free to slide along the frame 129 in a direction from top to bottom in FIG. 11. A similar knob 168, threaded shaft (not shown) and trunion mounted "T" shaped clamp (not shown) are provided on the left side of FIG. 11 but are not shown in detail for simplicity.

To remove the interchangeable test head, handle 38 is rotated counterclockwise 180° causing the actuable interface assemblies 36 and 140 to disengage the interface contacts thereof from the corresponding interface pins as described above. Subsequently, the knobs 164 and 168 are rotated, releasing the corresponding "T" shaped clamps and freeing the upper actuable interface assembly 140. The assembly 140 is then moved upward as seen in FIG. 11, away from the interchangeable test head 10 and the interchangeable test head 10 is removed. The reverse steps are used to lock another interchangeable test head in place. When the interchangeable test head 10 is properly in place the lower planar member thereof is resting on the mounting plates 111 and 142 of the actuable interface assemblies 36 and 140. Handle 38 is then rotated clockwise causing the actuable interface assemblies 36 and 140 to move the interface contacts thereof into engagement with the corresponding interface pins.

Although two actuable interface assemblies have been described, two are provided by way of example.

It should now be seen that the support means is formed by the mounting plates 111 and 142 of the upper and lower actuable interface assemblies, the front and rear clamping members 126 and 127, as well as the inner and outer end plates 144 and 148 and the trunion mounted "T" shaped clamp which allow the interchangeable test head to be inserted on and removed from such support means.

Although an exemplary embodiment of the invention has been disclosed for purposes of illustration it will be understood that various changes, modifications and substitutions may be incorporated into such embodiment without departing from the spirit of the invention as defined by the claims appearing hereinafter.

What is claimed:

1. A low insertion force electrical interconnect system comprising:
   support means;
   connector means adapted in cooperation with the support means for mounting on and removal from the support means and comprising a first array of electrical interface contacts;
   an actuable interface assembly affixed to said support means and comprising a second array of electrical interface contacts each for connection to a corresponding contact in the first array and carrier means for mounting the second array of contacts;
   the actuable interface assembly positioning the carrier means in a non actuated condition so that when the connector means is mounted on the support means each of the contacts in the first and second arrays is substantially parallel with the other contacts and is axially elongated along an axis to an exposed and free end and the first and second arrays of contacts are located in mirror image to each other with each contact in the second array spaced apart from the corresponding contact in the first array in both axial and transverse directions by the same amount and in the same direction;
   the actuable interface assembly comprising operable means and compound movement cam means connected to the operable means and to the carrier means, the compound movement cam means being operable, as the operable means is continuously moved from a non actuated condition to an actuated condition, for moving the carrier means, starting from the non actuated condition, so that all of the contacts in the second array are first moved parallel with the axes thereof to a position which is opposed in a transverse direction with the free and exposed ends of the corresponding contacts in the first array and are second moved in a substantially transverse direction to the axes thereof into engagement with the free and exposed ends of the corresponding contacts in the first array, the compound movement cam means comprising,
   at least one cam member,
   means for confining the movement of the cam member in a direction transverse to the axes of the contacts in the second array, the cam member comprising first and second interconnected cam portions for guiding the carrier means, the first cam portion extending at an acute angle to the axes of the contacts and the second cam portion extending substantially transverse to such axes,
   side thrust cam means comprising a first cam part affixed to the carrier means and a second cam part carried with the movement of the at least one cam member,
   guide means for guiding the movement of the carrier means so that all contacts in the second array move in a plane parallel with the axes of the contacts in the second array,
   the operable means moving said cam member to thereby cause the carrier means to first move along the first cam portion until it reaches the second cam portion and then move along the second cam portion, such movement along the first cam portion causing the contacts of the second array to move parallel with the axes of the contacts in the first array to such opposed position and such movement along the second cam portion causing interaction of the first and second cam parts to move the contacts of the second array in a substantially transverse direction to the axes thereof and into such engagement.

2. An electrical interconnect system according to claim 1 wherein the guide means comprises a slot elongated parallel with the axes of the contacts, said carrier means comprising a guided member extending into said slot.

3. An electrical interconnect system according to claim 2 wherein said carrier means comprises first and second sides and comprising at least one of said slots and at least one of said guided members on each of said first and second sides.

4. An electrical interconnect system according to claim 3 wherein there is a second cam member also having first and second cam portions and a second means for confining the movement of the second cam member in a direction transverse to the axes of the contacts in the second array, said cam member and said second cam member being positioned at, respectively, the first and second sides of said carrier means, the guided member at the second side of the carrier means additionally engaging and moving along the first and second cam portions in the second cam member.

5. An electrical interconnect system according to claim 1 wherein said operable means comprises a rotatable shaft and comprising further cam means moved by said shaft for so moving said cam member.

6. An electrical interconnect system according to claim 5 wherein the further cam means is eccentric and comprising a cam part on the cam member for engaging the further cam means and for being moved thereby.

7. A low insertion force actuable interface assembly comprising:
   an array of electrical interface contacts and carrier means for mounting the array of contacts, each of the contacts in the array being substantially parallel and axially elongated along an axis to an exposed and free end;
   operable means movable between a non actuated and an actuated condition;
   compound movement cam means connected to the operable means and to the carrier means and operable for moving the carrier means, as the operable means is continuously moved from the non actuated condition to the actuated condition, so as to first move each of the contacts in the array parallel with the axes of the contacts to an intermediate position and second for moving each of the contacts in the second array in a substantially transverse direction to the axes of the contacts in the array into a final actuated condition, the compound cam means comprising, at least one cam member, means for confining the movement of the cam member in a direction transverse to the axes of the contacts in the array, the cam member comprising first and second interconnected cam portions for guiding the carrier means, the first cam portion extending at an acute angle to the direction of the axes of the contacts and the second cam portion extending substantially transverse to the direction of such axes, side thrust means comprising a first cam part affixed to the carrier means and a second cam part carried with the movement of the at least one cam member, guide means for guiding the movement of the carrier means such that each contact in the array is moved along a plane which is parallel with the axes of the contacts in the array, the operable means moving said cam member to thereby cause the carrier means to first move along the first cam portion until it reaches the second cam portion and then move along the second cam portion, such movement along the first cam portion causing the contacts of the array to move parallel with the axes of the contacts to such intermediate position and such movement along the second cam portion causing interaction of the first and second cam portions to move the contacts of the array in a substantially transverse direction to the axes thereof to such final actuated position.

8. An actuable interface assembly according to claim 7 wherein the guide means comprises a slot elongated parallel with the axes of the contacts, said carrier means comprising a guided member extending into said slot.

9. An actuable interface assembly according to claim 8 wherein said carrier means comprises first and second sides and comprising at least one of said slots and at least one of said guided members on each of said first and second sides.

10. An actuable interface assembly according to claim 9 wherein there is a second cam member also having first and second cam portions and a second means for confining the movement of the second cam member in a direction transverse to the axes of the contacts, said cam member and said second cam member being positioned at, respectively, the first and second sides of said carrier means, the guided member at the second side of the carrier means additionally engaging and moving along the first and second cam portions in the second cam member.

11. An actuable interface assembly according to claim 8 wherein said operable means comprises a rotatable shaft and comprising further cam means moved by said shaft for so moving said cam member.

12. An actuable interface assembly according to claim 11 wherein the further cam means is eccentric and comprising a cam part on the cam member for engaging the further cam means and for being moved thereby.

13. A low insertion force actuable interface assembly comprising:
a carrier mounting an array of contacts substantially parallel to each other so that each contact extends to a free end; and
carrier moving means comprising
at least one cam member comprising first and second cam portions, the first cam portion extending at substantially an acute angle to the axes of the contacts, the second cam portion extending substantially transverse to such axes, means for moving the cam member, means for confining such movement of the cam member substantially transverse to the axes of the contacts, means connected to said carrier for following the first and second cam portions for thereby guiding movement of said carrier with such movement of the cam member, a first cam part connected to the carrier, a second cam part connected for movement with the cam member, movement of the cam member in a first direction causing the following means to follow, in sequence, the first and second cam portions, the first cam portion causing the carrier to move such that there is a movement of the contacts parallel with the axes of the contacts, the second cam part cooperating with the first cam part to move the carrier such that the contacts are moved substantially transverse to the axes thereof while the following means is following the second cam portion, and means for constraining the movement of the carrier such that the contacts are constrained to move substantially parallel with the axes of the contacts while the following means is following the first cam portion.

14. A low insertion force actuable interface assembly according to claim 13 wherein the means for constraining comprises means for cooperating with and constraining the movement of the following means to a direction substantially parallel with the axes of the contacts.

15. A low insertion force actuable interface assembly according to claim 13 wherein the moving means comprises manually operable means for moving the at least one cam bar.

16. A low insertion force actuable interface assembly according to claim 13 comprising contact protection means extending beyond the free and exposed ends of said contacts.

17. A low insertion force actuable interface assembly according to claim 13 comprising at least one spring operative, when the cam member is moved in a direction opposite to the first direction, for urging the carrier to move in a direction substantially opposite to that moved during the transverse movement of the carrier.

18. A low insertion force actuable interface assembly according to claim 17 wherein the carrier moving means comprises:
a second cam member connected for movement in a spaced apart and parallel relationship to the at least one cam member;
the second cam member comprising third and fourth cam portions, the first cam portion extending at substantially an acute angle to the axes of the contacts, the fourth cam portion extending substantially transverse to such axes;
means for confining such movement of the second cam member in a direction substantially transverse to the axes of the contacts; and
further means connected to said carrier for following the second and third cam portions for thereby guiding movement of said carrier with such movement of the second cam member.

19. A low insertion force actuable interface assembly according to claim 18 wherein the at least one cam member comprises fifth and sixth cam portions and the second cam member comprises seventh and eighth cam portions, the fifth and seventh cam portions extending at substantially an acute angle to the axes of the contacts and the sixth and eighth cam portions extending substantially transverse to such axes, and still further following means connected to said carrier for following the fifth and sixth cam portions and even still further following means connected to said carrier for following the seventh and eighth cam portions, the still further and even still further following means thereby guiding movement of said carrier with such movement of the at least one cam member and second cam member.

20. A low insertion force actuable interface assembly according to claim 18 wherein the means for constraining comprises means for cooperating with and constraining the movement of each of the following means to a direction substantially parallel with the axes of the contacts.

21. A low insertion force actuable interface assembly according to claim 20 wherein the means for constraining comprises a slot elongated substantially parallel with the axes of the contacts.

22. A low insertion force actuable interface assembly according to claim 21 wherein the constraining means comprises a separate slot for each of the following means, each of said slots being elongated substantially parallel with the axes of the contacts.

23. A low insertion force actuable interface assembly according to claim 21 wherein the carrier means comprises first and second sides and comprising at least two of said slots and at least two of said following means on each of said first and second sides.

24. A low insertion force actuable interface assembly according to claim 13 wherein the moving means comprises a rotatable shaft and comprising further cam means moved by said shaft for moving said cam member.

25. A low insertion force actuable interface assembly according to claim 24 wherein the further cam means is eccentric and comprising a cam part on the cam member for engaging the further cam means and for being moved thereby.

26. A low insertion force actuable interface assembly according to claim 13 comprising mounting means operative, after the cam member has been moved in a direction opposite from the first direction, for extending beyond the free and exposed ends of the contacts and having an opening therein to expose the free and exposed ends of the contacts, the mounting means thereby protecting the contacts in the array during insertion of a connector onto the interface assembly.

27. A low insertion force actuable interface assembly according to claim 26 comprising at least one combined locking and contact protection member mounted on the carrier located and adapted so as to extend between the contacts in the array and beyond the free and exposed ends of the contacts in the array, the at least one combined locking and contact protection member being carried by the carrier means in the opening of the mounting means during movement of the array of contacts.

28. A low insertion force actuable interface assembly according to claim 27 comprising a plurality of said combined locking and contact protection members, separating the contacts into groups.

* * * * *